(12) United States Patent
Nitta et al.

(10) Patent No.: US 8,024,685 B2
(45) Date of Patent: Sep. 20, 2011

(54) DELAY ANALYSIS SUPPORT APPARATUS, DELAY ANALYSIS SUPPORT METHOD AND COMPUTER PRODUCT

(75) Inventors: Izumi Nitta, Kawasaki (JP); Toshiyuki Shibuya, Kawasaki (JP); Katsumi Homma, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 777 days.

(21) Appl. No.: 12/073,038

(22) Filed: Feb. 28, 2008

(65) Prior Publication Data

US 2008/0244487 A1 Oct. 2, 2008

(30) Foreign Application Priority Data

Mar. 27, 2007 (JP) .................... 2007-081616

(51) Int. Cl.
*G06F 17/50* (2006.01)
(52) U.S. Cl. ....................................... 716/113
(58) Field of Classification Search ............. 716/30–139
See application file for complete search history.

(56) References Cited

U.S. PATENT DOCUMENTS

2005/0276135 A1 12/2005 Yonezawa
2006/0236279 A1 10/2006 Homma
2006/0236280 A1 10/2006 Homma

FOREIGN PATENT DOCUMENTS

| JP | 9-311877 | 12/1997 |
|----|----------|---------|
| JP | 2002-279012 | 9/2002 |
| JP | 2005-92885 | 4/2005 |
| JP | 2005-352787 | 12/2005 |
| JP | 2006-268478 | 10/2006 |
| JP | 2006-268479 | 10/2006 |

OTHER PUBLICATIONS

Notice of Rejection, mailed Jul. 14, 2009, in corresponding Japanese Application No. 2007-081616 (5 pp.).

*Primary Examiner* — Vuthe Siek
*Assistant Examiner* — Aric Lin
(74) *Attorney, Agent, or Firm* — Staas & Halsey LLP

(57) ABSTRACT

A delay analysis support apparatus that supports analysis of delay in a target circuit includes an acquiring unit that acquires error information concerning a cell-delay estimation error that is dependent on a characterizing tool; an error calculating unit that calculates, based on the error information and a first probability density distribution concerning the cell delay of each cell and obtained from the cell delay estimated by the characterizing tool, a second probability density distribution that concerns the cell-delay estimation error of each cell; and an linking unit that links the second probability density distribution and a cell library storing therein the first probability density distribution.

15 Claims, 9 Drawing Sheets

| CELL NAME | C1 | C2 | ...... | Cn |
|---|---|---|---|---|
| C1 |  | 0.7 | ...... | 0.0 |
| C2 | 0.7 |  | ...... | 0.0 |
| ⋮ | ⋮ | ⋮ | ⋮ | ⋮ |
| Cn | 0.0 | 0.0 | ...... |  |

FIG.6

```
                        600
PATH P1
PIN NAME     STEP    TOTAL   ERROR
FF1.OUT1     0.0     0.0     0.0
INV1.IN      0.0     0.0     0.0
INV1.OUT     112.0   112.0   6.0
INV2.IN      0.0     112.0   6.0
INV2.OUT     105.0   217.0   6.7
FF2.IN1      0.0     217.0   6.7
ARRIVAL TIME         217.0   6.7
PATH P2
FF1.OUT2     0.0     0.0     0.0
FF2.IN2      10.0    10.0    0.0
REQUIRED TIME        10.0    0.0
SLACK                -207.0  -6.7
```

FIG.7

START
↓
CELL LIBRARY CREATION PROCESSING — S701
↓
STATISTICAL DELAY ANALYSIS PROCESSING — S702
↓
OUTPUT DELAY ANALYSIS RESULT — S703
↓
END

US 8,024,685 B2

DELAY ANALYSIS SUPPORT APPARATUS, DELAY ANALYSIS SUPPORT METHOD AND COMPUTER PRODUCT

CROSS-REFERENCE TO RELATED APPLICATIONS

This application is based upon and claims the benefit of priority from the prior Japanese Patent Application No. 2007-081616, filed on Mar. 27, 2007, the entire contents of which are incorporated herein by reference.

BACKGROUND OF THE INVENTION

1. Field of the Invention

The present invention relates to technology of delay analysis in a circuit.

2. Description of the Related Art

In recent years, with the miniaturization of semiconductor integrated circuits, the influence of statistical variations, e.g., process variations, reductions in power supply voltage, and crosstalk, has become considerable, and circuit delay variations have increased. In conventional static timing analysis (STA), circuit delay variations are accommodated by a larger delay margin; however, timing design becomes difficult due to the larger the delay margin.

Therefore, the need for statistical static timing analysis (SSTA) that can reduce such unnecessary delay margins with accurate consideration of statistical variations is increasing. As a delay analysis technique based on SSTA, for example, a technology of performing delay timing analysis with consideration of a correlation of performance between wiring lines or cells in an analysis target circuit has been provided (see, for example, Japanese Patent Application Laid-open No. 2002-279012 and Japanese Patent Application Laid-open No. 2005-092885).

However, according to the conventional technologies, an analysis error that is dependent on an analysis tool (characterizing tool) that estimates delay in each cell, e.g., an error included in an input value or an error that occurs due to an algorithm or a numerical calculation is not considered at all.

Therefore, the delay value that is actually used for a cell in SSTA is a value that includes an analysis error in the original delay variation, and the execution of SSTA utilizing this delay value degrades the overall SSTA analysis accuracy, resulting in a problem that the merit of the fundamental accuracy of SSTA is negated.

FIG. 10 is a schematic illustrating a problem with the conventional technology. As shown in FIG. 10, a probability density distribution P is a delay distribution that is actually used in SSTA of a cell, a probability density distribution Q is a delay distribution accurately representing delay variation of the cell, and a probability density distribution R is a delay distribution concerning analysis error in the cell.

As shown in FIG. 10, the delay distribution that is actually used in SSTA of the cell (probability density distribution P) includes analysis error and is indicative of the accurate delay distribution of the cell (probability density distribution Q) including a delay distribution concerning an analysis error that is dependent on a characterizing tool (probability density distribution R).

Therefore, when the delay distribution of the cell obtained from the characterizing tool is used to execute SSTA, a pessimistic delay distribution is calculated due to the analysis error, and consequently, the circuit design must be adjusted, resulting in a problem of increased burden on the designer and a longer design period.

SUMMARY OF THE INVENTION

It is an object of the present invention to at least solve the above problems in the conventional technologies.

A computer-readable recording medium according to one aspect of the present invention, stores therein a delay analysis support computer program that supports analysis of delay in a target circuit and causes a computer to execute acquiring error information concerning a cell-delay estimation error that is dependent on a characterizing tool that estimates cell delay; calculating, based on the error information and a first probability density distribution that concerns the cell delay of each cell and is obtained from the cell delay estimated by the characterizing tool, a second probability density distribution that concerns the cell-delay estimation error of each cell; and linking the second probability density distribution and a cell library storing therein the first probability density distribution.

A delay analysis support apparatus according to another aspect of the present invention, supports analysis of delay in a target circuit and includes an acquiring unit that acquires error information concerning a cell-delay estimation error that is dependent on a characterizing tool that estimates cell delay; an error calculating unit that calculates, based on the error information and a first probability density distribution that concerns the cell delay of each cell and is obtained from the cell delay estimated by the characterizing tool, a second probability density distribution that concerns the cell-delay estimation error of each cell; and an linking unit that links the second probability density distribution and a cell library storing therein the first probability density distribution.

A delay analysis support method according to yet another aspect of the present invention, supports analysis of delay in a target circuit and includes acquiring error information concerning a cell-delay estimation error that is dependent on a characterizing tool that estimates cell delay; calculating, based on the error information and a first probability density distribution that concerns the cell delay of each cell and is obtained from the cell delay estimated by the characterizing tool, a second probability density distribution that concerns the cell-delay estimation error of each cell; and linking the second probability density distribution and a cell library storing therein the first probability density distribution.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 3 is a schematic illustrating a data structure of a correlation coefficient table;

FIG. 6 is an explanatory drawing of a specific example of an output format;

FIG. 7 is a flowchart of delay analysis processing of the delay analysis support apparatus;

DETAILED DESCRIPTION OF THE PREFERRED EMBODIMENTS

Referring to the accompanying drawings, exemplary embodiments according to the present invention are explained in detail below.

Figure 1:
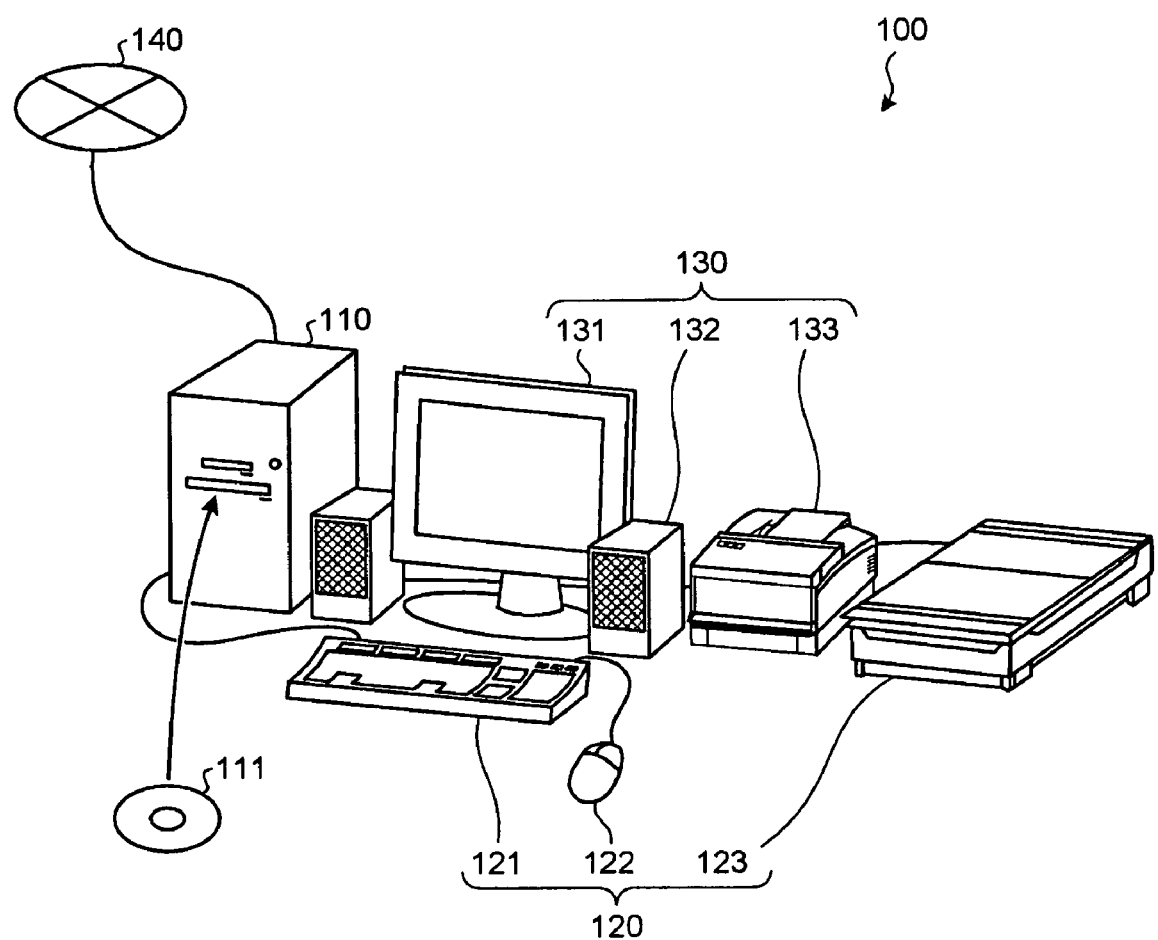
FIG. 1 is a block diagram of a delay analysis support apparatus according to an embodiment of the present invention.

FIG. 1 is a block diagram of a delay analysis support apparatus according to an embodiment of the present invention. As shown in FIG. 1, a delay analysis support apparatus 100 includes a computer 110, an input device 120, and an output device 130, and can be connected with a network 140, e.g., an LAN, a WAN, or the Internet through a non-depicted router or a modem.

The computer 110 has a CPU, a memory, and an interface. The CPU controls the entire delay analysis support apparatus 100. The memory is formed of, for example, read-only memory (ROM), a random access memory (RAM), a hard disk (HD), an optical disk 111, or a flash memory. The memory is used as a work area for the CPU.

Various programs are stored in the memory and loaded in response to a command from the CPU. The reading/writing data from/into the HD and the optical disk 111 is controlled by a disk drive. The optical disk 111 and the flash memory are removable. The interface controls input from the input device 120, output to the output device 130, and transmission/reception with respect to the network 140.

As the input device 120, a keyboard 121, a mouse 122, and a scanner 123 are adopted. The keyboard 121 includes keys to input, for example, characters, numeric figures, and various kinds of instructions, and data is input through the keyboard 121. The keyboard 121 may be a touch panel type. The mouse 122 is used to move a cursor, select a range, move a window, or change a window size. The scanner 123 optically reads an image as image data, which is stored in the memory of the computer 110. The scanner 123 may have an optical character recognition (OCR) function.

As the output device 130, a display 131, a speaker 132, a printer 133, and others are adopted. The display 131 displays a cursor, an icon, or a tool box as well as data, such as text, an image, and function information. The speaker 132 outputs sound, e.g., a sound effect or a text-to-voice converted sound. The printer 133 prints image data or text data.

Figure 2:
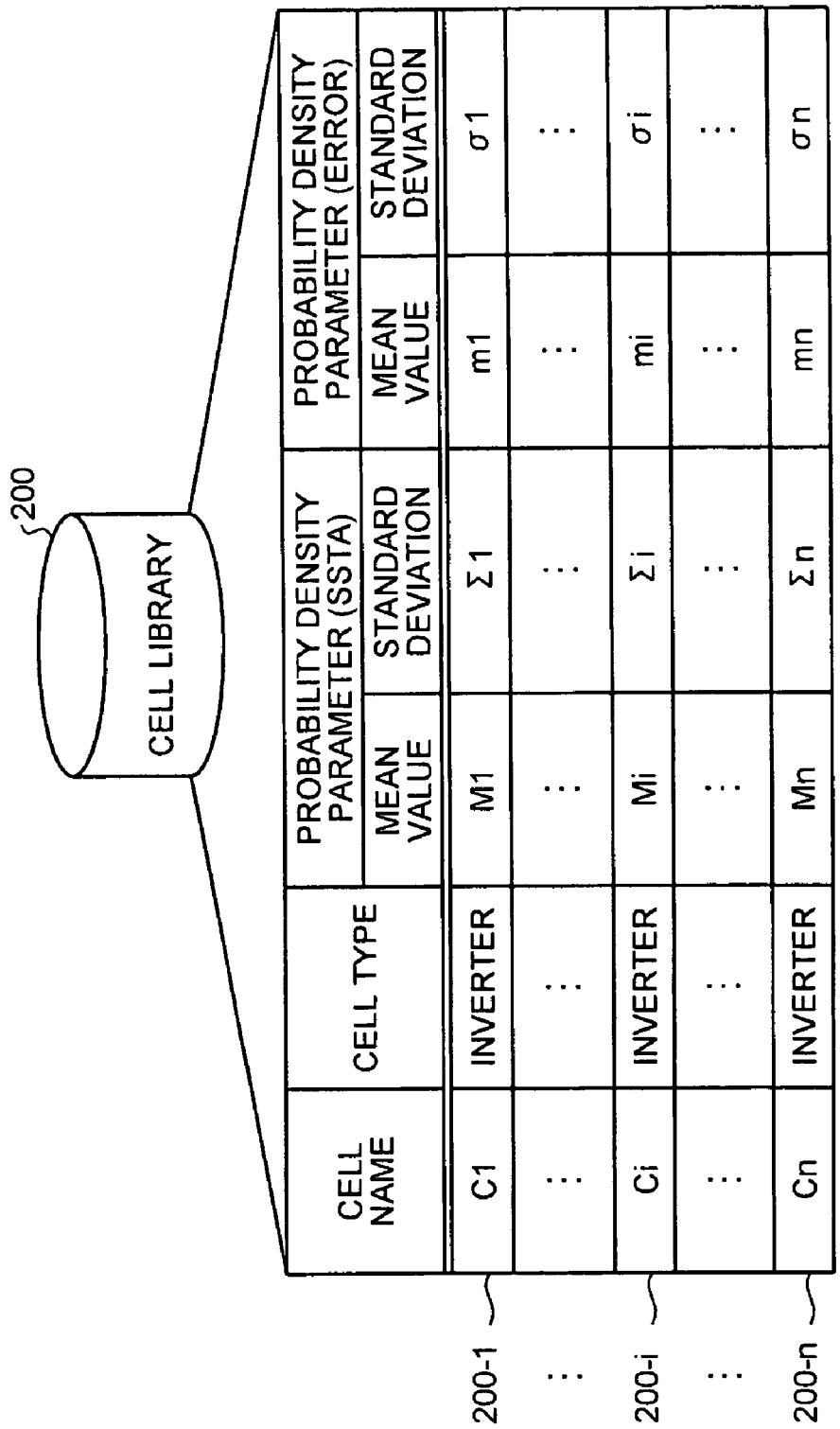
FIG. 2 is a schematic of contents stored in a cell library.

FIG. 2 is a schematic of contents stored in a cell library. As show in FIG. 2, a cell library 200 stores, respectively, pieces of delay distribution information 200-1 to 200-n for each cell. Each of the pieces of delay distribution information 200-1 to 200-n includes a cell name, a cell type, a probability density parameter for SSTA, and a probability density parameter (error) for each cell.

The cell name is the name of a cell. The cell type is information indicative of performance characteristics of the cell and cell function (type), e.g., an inverter, a flip-flop, a buffer, or a wiring line. The probability density parameter (for SSTA) is a probability density parameter concerning the delay of each cell (the delay that is actually used in SSTA for estimating circuit delay of an analysis target circuit), and has a mean value $M1$ to $Mn$ and a standard deviation $\Sigma 1$ to $\Sigma n$.

The probability density parameter (error) is a probability density parameter concerning an estimation error of a characterizing tool that estimates delay of the cell, and has a mean value $m1$ to $mn$ and a standard deviation $\sigma 1$ to $\sigma n$.

Here, taking a cell $Ci$ as an example, the cell type is an inverter, and the cell has a mean value $Mi$ and a standard deviation $\Sigma i$ as the probability density parameters (for SSTA) and also has a mean value $mi$ and a standard deviation $\sigma i$ as the probability density parameters (error). The cell library 200 stores a correlation coefficient table 300, described hereinafter.

Delay variation of each cell and variation of estimation error in the delay of each cell are represented in the form of normal distributions (mean values and standard deviations) in the cell library 200 depicted in FIG. 2; however, a probability density distribution that is not a normal distribution may be represented by using piecewise linear approximation.

Specifically, for example, the probability density distribution concerning delay of each cell may be divided by N in the range of $\pm j\Sigma$ ($j$ is an arbitrary natural number) represented by coordinates of "N+1" points after division, e.g., (X, Y)=(delay value, density distribution). The probability density distribution concerning an estimation error in the delay of each cell may be also represented by using piecewise linear approximation.

Figure 3:
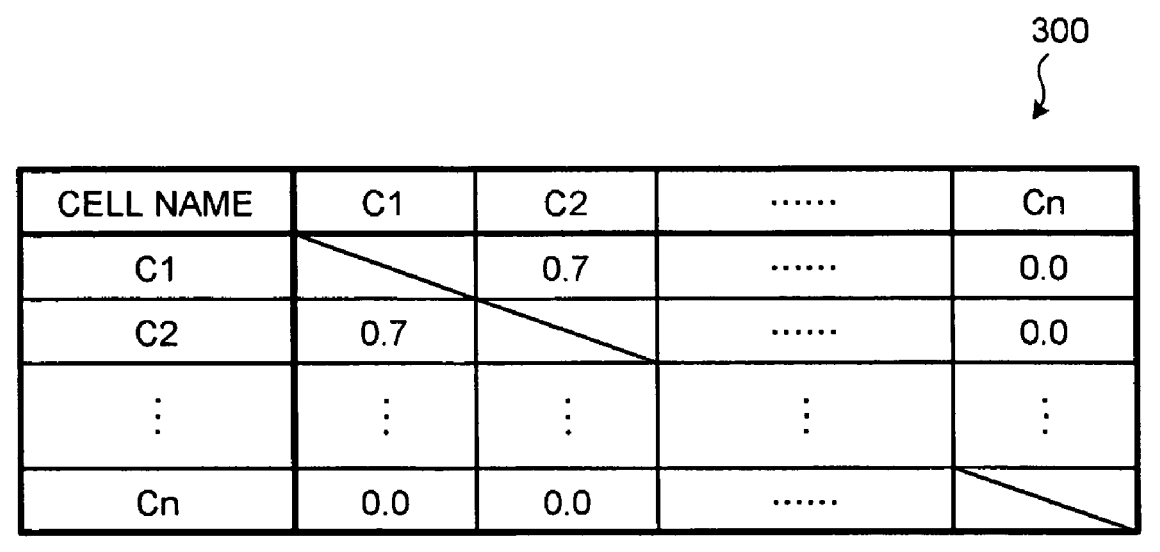

FIG. 3 is a schematic illustrating a data structure of a correlation coefficient table. According to the embodiment, a correlation coefficient table 300 is stored in the cell library 200 depicted in FIG. 2.

As shown in FIG. 3, the correlation coefficient table 300 stores correlation coefficients according to combinations of cells in the cell library 200. The correlation coefficient is an index representing a mutual correlation between cells, i.e., the influence of one cell on another cell. The correlation coefficient is determined based on performance characteristics (e.g., a function or performance) of a cell.

Here, it is assumed that "1" is a correlation coefficient between cells having the same function and the same performance, "0.7" is a correlation coefficient between cells having the same function and different performances relative to each other, and "0" is a correlation coefficient between cells of any other type. For example, when both a cell C1 and a cell C2 have a function of "inverter" and performances that are different from each other, a correlation coefficient representing a correlation between the cell C1 and the cell C2 is "0.7".

Figure 4:
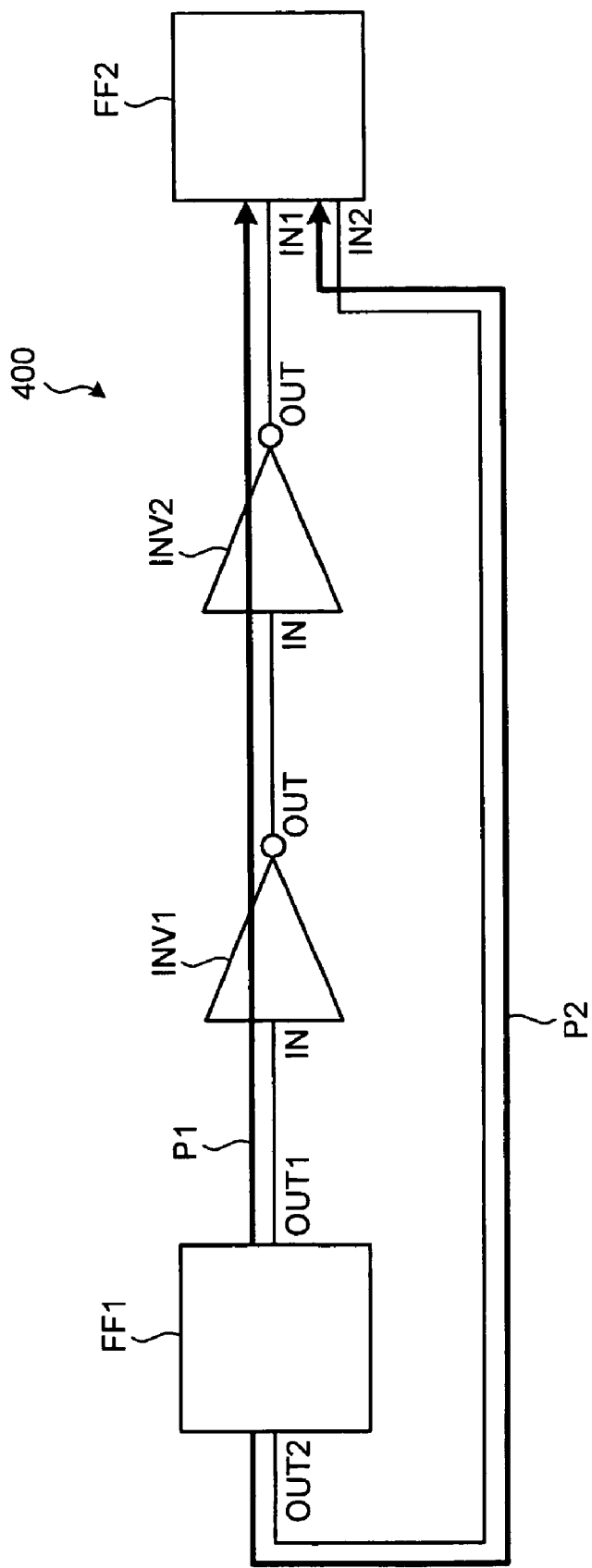
FIG. 4 is a circuit diagram illustrating an example of an analysis target circuit according to the embodiment.

FIG. 4 is a circuit diagram illustrating an example of an analysis target circuit according to the embodiment of the present invention. The circuit diagram depicts a part of the analysis target circuit.

As shown in FIG. 4, an analysis target circuit 400 includes a flip-flop FF1, an inverter INV1, an inverter INV2, and a flip-flop FF2. A path P1 passes through the flip-flop FF1, the inverter INV1, the inverter INV2, and the flip-flop FF2, and a path P2 passes through the flip-flop FF1 and the flip-flop FF2.

In the path P1, OUT1 of the flip-flop FF1 is connected with IN of the inverter INV1, OUT of the inverter INV1 is connected with IN of the inverter INV2, and OUT of the inverter INV2 is connected with IN1 of the flip-flop FF2. In the path P2, OUT2 of the flip-flop FF1 is connected with IN2 of the flip-flop FF2.

Figure 5:
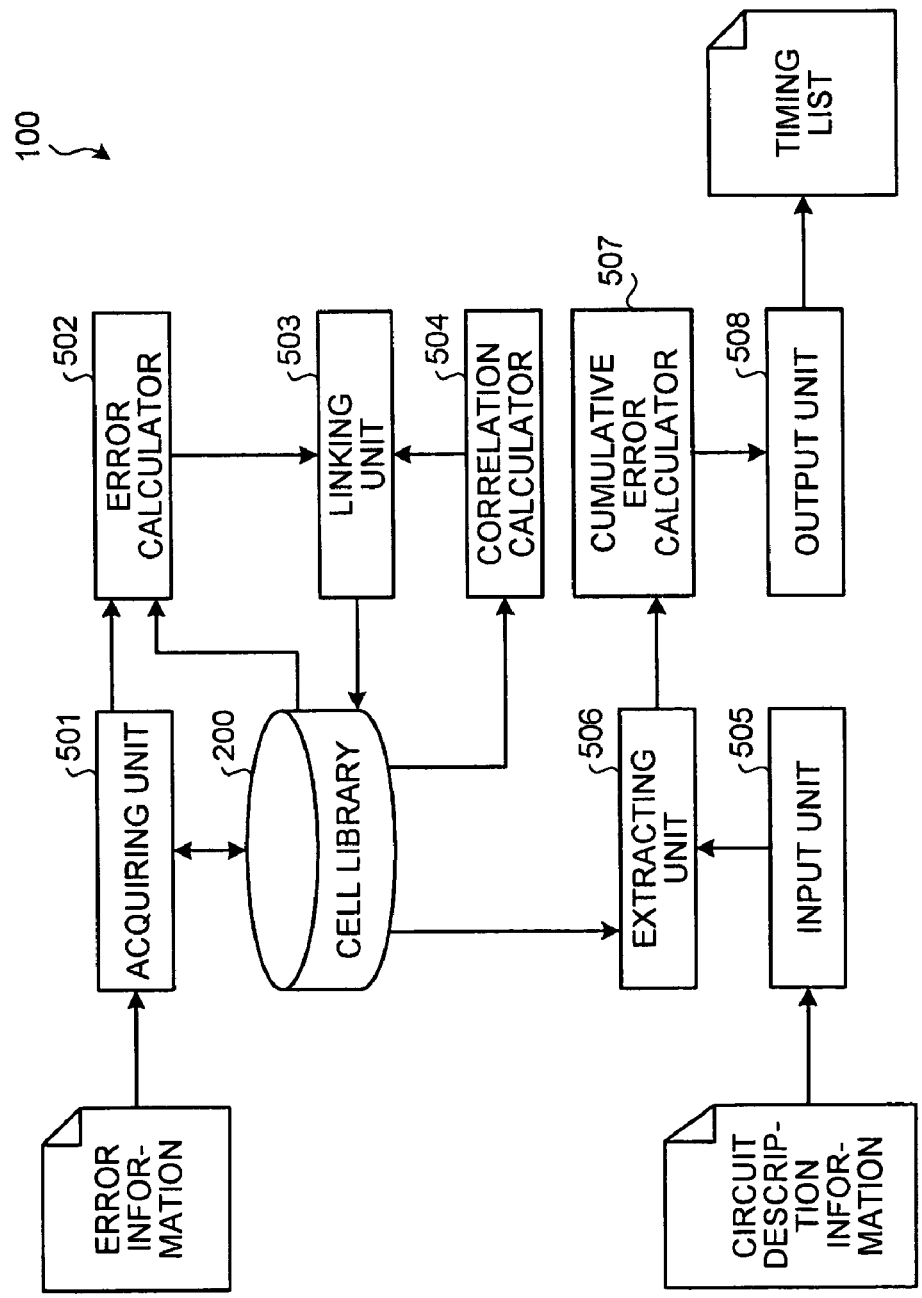
FIG. 5 is a functional diagram of the delay analysis support apparatus.

FIG. 5 is a functional diagram the delay analysis support apparatus. As shown in FIG. 5, the delay analysis support apparatus 100 includes the cell library 200, an acquiring unit 501, an error calculator 502, a linking unit 503, a correlation calculator 504, an input unit 505, an extracting unit 506, a cumulative error calculator 507, and an output unit 508.

The respective functions of the units 501 to 508 can be implemented by causing the CPU to execute a corresponding program stored in the memory. Output data of the respective units 501 to 508 is stored in the memory. Corresponding to the connection destinations, indicated by the arrows in FIG. 5, the CPU reads the output data of the connection sources from the memory, and executes a corresponding program.

According to the embodiment, the execution of SSTA on an analysis target circuit with consideration of estimation error in delay that is dependent on a characterizing tool that estimates delay of each cell enables improvement of overall SSTA analysis accuracy to estimate circuit delay of the analysis target circuit with the fundamental accuracy of SSTA.

Figure 10:
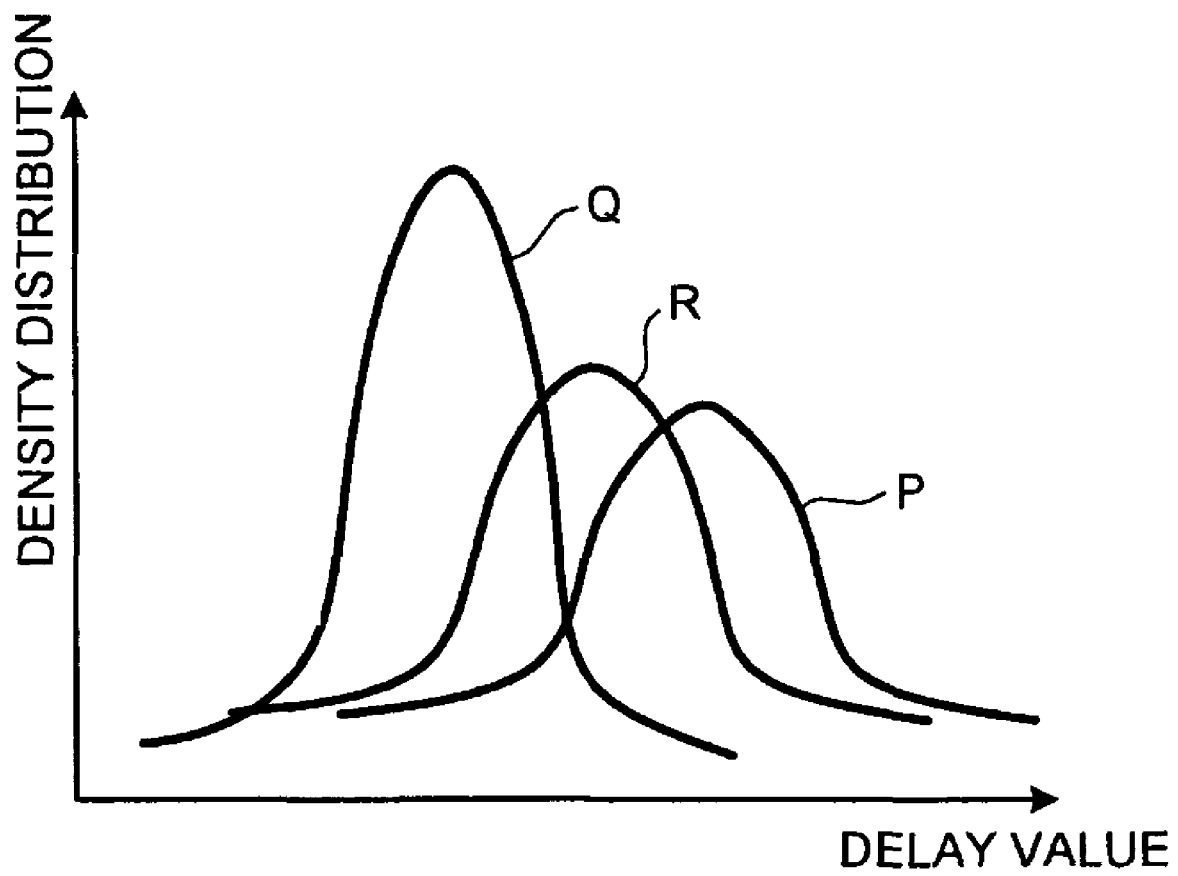
FIG. 10 is a schematic illustrating a problem with conventional technology.

Specifically, SSTA of the analysis target circuit with consideration of an estimation error in delay that is dependent on the characterizing tool is realized by statistical delay analysis unique to each of the probability density distributions P (distribution actually used in SSTA for each cell) and R (distribution concerning analysis error in each cell) depicted in FIG. 10.

First, the acquiring unit 501 acquires error information concerning a cell delay estimation error that is dependent on the characterizing tool that estimates the cell delay. Specifically, error information directly input to the delay analysis support apparatus 100 may be acquired, or error information previously stored in the cell library 200 may be acquired. The error information acquired by the acquiring unit 501 is stored in the memory.

Here, the characterizing tool is an analysis tool that extracts characteristics of each cell, and is, for example, an analysis tool that executes a simulation of a transistor base constituting a cell to calculate a delay value of the cell. The delay value (delay distribution) of the cell acquired by the characterizing tool is registered in, for example, the cell library 200 to be used in SSTA for estimating circuit delay of the analysis target circuit.

On the other hand, when using the characterizing tool to estimate a delay distribution of each cell, an error occurs in the estimation due to an error included in an input value (e.g., voltage conditions or temperature conditions) or an error owing to an algorithm or a numerical calculation. The error is an intrinsic estimation error that is dependent on each characterizing tool.

The error information is information indicative of an estimation error of each cell that is dependent on each characterizing tool. For example, the error information is defined as a variation range of the probability density parameters (mean value: $M_i$, standard deviation: $\Sigma_i$) concerning delay of a cell $C_i$ (i=1 to n) obtained from the characterizing tool. For example, an error in a mean value $m_i$ of the probability density distribution concerning delay of the cell $C_i$ can be defined as "$\pm a$ %", and an error in a standard deviation $\sigma_i$ of the same can be defined as "$\pm b$ %", where a, b are integral values.

An estimation error in delay may be defined by setting arbitrary values to the probability density parameters (mean value $m_i$, standard deviation $\sigma_i$) concerning the estimation error or giving an equation that determines the value. For example, the mean value $m_i$ of the probability density distribution concerning delay of the cell $C_i$ may be fixed to "0", and the standard deviation $\sigma_i$ may be given based on the following equation (1). Where, a and b are arbitrary integral values.

$$\sigma i = \sqrt{\left(M i \times \frac{a}{100}\right)^2 + \left(\sum i \times \frac{b}{100}\right)^2} \quad (1)$$

The error information may be information indicative of an estimation error in the delay of each cell or may be information indicative of an estimation error in delay that is common to all cells. The error information may be appended to each commercial characterizing tool, or may be information arbitrarily set by a user.

The error calculator 502 calculates a probability density distribution concerning an estimation error in the delay of each cell based on the error information acquired by the acquiring unit 501 and the probability density distribution concerning delay of each cell obtained by the characterizing tool.

Specifically, for example, the error calculator 502 reads the error information acquired by the acquiring unit 501 from the memory, further reads the probability density distribution concerning delay of each of the cells C1 to Cn from the cell library 200, calculates a probability density distribution concerning an estimation error in the delay of each of the cells C1 to Cn, and registers a calculation result in the cell library 200.

A technique of calculating the probability density distribution concerning an estimation error by the error calculator 502 will now be explained while taking the cell C1 as an example. Here, it is assumed that a mean value of the probability density distribution concerning an estimation error in the delay of C1 is M1=100.0, a standard deviation is $\Sigma 1$=12.0, and the error information is "5%" of a mean value of the probability density distribution concerning the delay of each cell and "50%" of a standard deviation of the same.

First, the error calculator 502 reads the error information from the memory, and also reads the probability density parameters (M1, $\Sigma 1$) concerning delay of the cell C1 from the cell library 200. The error calculator 502 calculates the probability density parameters (m1, $\sigma 1$) concerning an estimation error in the delay of the cell C1 based on the information.

Specifically, since the error of the mean value is 5%, 5% of the mean value M1 (M1=100.0) of the probability density distribution concerning delay of the cell C1 is the mean value m1 (m1=5.0) of the probability density distribution concerning the estimation error in the delay of the cell C1.

Since the error of the standard deviation is 50%, 50% of the standard deviation $\Sigma 1$ ($\Sigma 1$=12.0) of the probability density distribution concerning delay of the cell C1 is the standard deviation $\sigma 1$ ($\sigma 1$=6.0) of the probability density distribution concerning the estimation error in the delay of the cell C1.

The linking unit 503 links the cell library that stores the probability density distribution concerning delay of each cell with the probability density distribution concerning the estimation error in the delay of each cell calculated by the error calculator 502. Specifically, the linking unit 503 reads a calculation result obtained by the error calculator 502 from the memory, links the calculation result with the probability density distribution concerning delay of each cell, and stores the result in the cell library 200.

The correlation calculator 504 calculates a correlation coefficient representing a mutual correlation between cells based on performance characteristics of each cell. Specifically, for example, the correlation calculator 504 reads information concerning performance characteristics of each cell in the analysis target circuit from the cell library 200, calculates a correlation coefficient representing a mutual correlation between cells, forms a table showing the calculation result (e.g., the correlation coefficient table 300), and stores the table in the memory.

The performance characteristics of each cell are, for example, a cell type depicted in FIG. 2, and represent a function or a performance of each cell. The correlation coefficient is an index indicative of a mutual correlation between cells, and is determined based on performance characteristics of each cell. Specifically, for example, considering cells having the same function, since the influence of one cell on another cell is large, their correlation is greater and the correlation coefficient is larger. Considering cells having different functions, since the influence of one cell on another cell is small, their correlation is less and the correlation coefficient is smaller.

As shown in FIG. 3, the correlation coefficient may be represented in the form of a value that is "not less than 0 and not greater than 1", or may be represented by using the probability density distribution with consideration of a variation in a value that can be taken as the correlation coefficient. In this case, the correlation coefficient between cells can be represented in the form of, for example, a mean value and a standard deviation of the probability density distribution concerning the correlation coefficient.

The linking unit 503 also links the correlation coefficient calculated by the correlation calculator 504 with the cell library storing the probability density distribution concerning delay of each cell. Specifically, the linking unit 503 reads the correlation coefficient table 300 showing the calculation result obtained by the correlation calculator 504 in a table from the memory, and links the correlation coefficient table 300 with the cell library 200.

The input unit 505 receives input of circuit description information concerning the analysis target circuit. The circuit description function is, for example, a net list of the analysis target circuit 400 depicted in FIG. 4. Specifically, when a user operates the input device 120, e.g., the keyboard 121 or the mouse 122 depicted in FIG. 1, input of circuit description information is received. The circuit description information input through the input unit 505 is stored in the memory.

The extracting unit 506 extracts, based on the circuit description information input through the input unit 505, the probability density distribution concerning an estimation error in the delay of each cell in the analysis target circuit from a probability density distribution group linked by the linking unit 503.

Specifically, for example, the extracting unit 506 reads the circuit description information input through the input unit 505 from the memory, extracts probability density parameters concerning an estimation error of each cell in the analysis target circuit, and stores the extracted parameters in the memory. Taking the analysis target circuit 400 depicted in FIG. 4 as an example, the probability density parameters concerning estimation errors of the flip-flop FF1, the inverter INV1, the inverter INV2, and the flip-flop FF2 are extracted.

The cumulative error calculator 507 calculates an estimation error in the delay of the entire analysis target circuit by cumulating, based on the probability density distribution extracted by the extracting unit 506, the estimation error in the delay of each cell in the analysis target circuit.

Specifically, for example, the cumulative error calculator 507 reads the probability density parameters concerning an estimation error extracted by the extracting unit 506 from the memory, executes SSTA utilizing an existing algorithm to cumulate estimation error in the delay of each cell in the analysis target circuit, calculates an estimation error in the delay of the entire analysis target circuit, and stores the calculated error in the memory. A delay analysis technique based on SSTA is a known technology; therefore, explanation thereof is omitted herein.

The output unit 508 reads the calculation result obtained by the cumulative error calculator 507 from the memory and outputs the calculation result. At this time, for example, the output unit 508 may output a delay analysis result of the analysis target circuit based on the probability density distribution concerning delay of each cell in the analysis target circuit (e.g., a timing list 600 depicted in FIG. 6) together with the calculation result obtained by the cumulative error calculator 507.

Specifically, for example, execution of SSTA utilizing an existing algorithm based on a probability density distribution: Pi (mean value: M1 to Mn, standard deviation: Σ1 to Σn) concerning the delay of each cell and stored in the cell library 200 enables estimation of circuit delay of the analysis target circuit. Subsequently, the delay analysis result is output together with the calculation result obtained by the cumulative error calculator 507.

When outputting a delay analysis result of the analysis target circuit together with an estimation error in the delay of the entire analysis target circuit, an absolute value of the estimation error may be output, and a ratio of the estimation error in the delay with respect to the delay analysis result of the analysis target circuit may be output.

Statistical delay analysis based on the probability density distribution Pi concerning delay of each cell in the analysis target circuit may be executed in the delay analysis support apparatus 100, or a delay analysis result of statistical delay analysis executed by an external computer apparatus may be acquired.

The format of output by the output unit 508 may be displayed on the display 131, printed by the printer 133, output (storage) to the memory, or transmitted to an external computer apparatus. A specific example of the format of output by the output unit 508 is explained hereinafter with reference to FIG. 6.

The extracting unit 506 extracts a correlation coefficient representing a mutual correlation between cells in the analysis target circuit from a correlation coefficient group linked by the linking unit 503. Specifically, for example, the extracting unit 506 extracts a correlation coefficient representing a mutual correlation between cells in the analysis target circuit from the correlation coefficient table 300 stored in the cell library 200, and stores the extracted correlation in the memory.

The cumulative error calculator 507 further calculates an estimation error in the delay of the entire analysis target circuit based on the correlation coefficient extracted by the extracting unit 506. Specifically, when cells in the analysis target circuit have a correlation, the cumulative error calculator 507 calculates an estimation error in the delay in the entire analysis target circuit with consideration of the correlation. A delay analysis technique based on SSTA that takes into account a correlation between cells in the analysis target circuit is a known technology and therefore, explanation thereof is omitted herein.

FIG. 6 is an explanatory drawing of a specific example of the output format. An example in which a delay value and a slack value of the analysis target circuit 400 are output as a delay analysis result (timing list 600) according to the embodiment will be explained. Delay in wiring lines is not considered.

As shown in FIG. 6, the timing list 600 shows a delay analysis result of the analysis target circuit 400 depicted in FIG. 4. In FIG. 6, "step" represents a delay value in each cell in the path P1 or P2; "total" represents a cumulative delay value in the path P1 or P2; and "error" represents a cumulative delay value concerning an estimation error in the path P1 or P2. Each delay value is expressed in pico-seconds (ps).

"Arrival time" represents a delay value of the path P1; "required time" represents a delay value of the path P2; and "slack" represents a slack value of the analysis target circuit 400. The slack represents a margin degree for delay with respect to a target performance, and a positive slack is provided when the target performance is achieved whilst a negative slack is provided when the target performance is not achieved.

Specifically, the slack can be represented in the form of a difference between a delay value of the path P1 and a delay value of the path P2. In the example, since a delay value of the path P1 is 217 ps and a delay value of the path P2 is 10 ps, a slack value of the analysis target circuit 400 is −207 ps (negative slack).

The timing list 600 enables a user to instinctively determine how much an error in the delay of the entire analysis target circuit 400 (occurring due to an estimation error in the delay of each cell) affects SSTA of the analysis target circuit 400. Here, since an error in the delay of the entire analysis target circuit 400 is 6.7 ps, an unnecessary delay margin can be reduced by an amount corresponding to the error.

Since the slack value of the analysis target circuit 400 is also presented, the user can instinctively determine how much circuit delay of the analysis target circuit 400 should be improved to achieve the target performance.

FIG. 7 is a flowchart of delay analysis processing of the delay analysis support apparatus 100. As shown in the flowchart of FIG. 7, cell library creation processing is first executed (step S701), then statistical delay analysis processing is performed (step S702), and finally, the output unit 508 outputs a delay analysis result (step S703).

Figure 8:
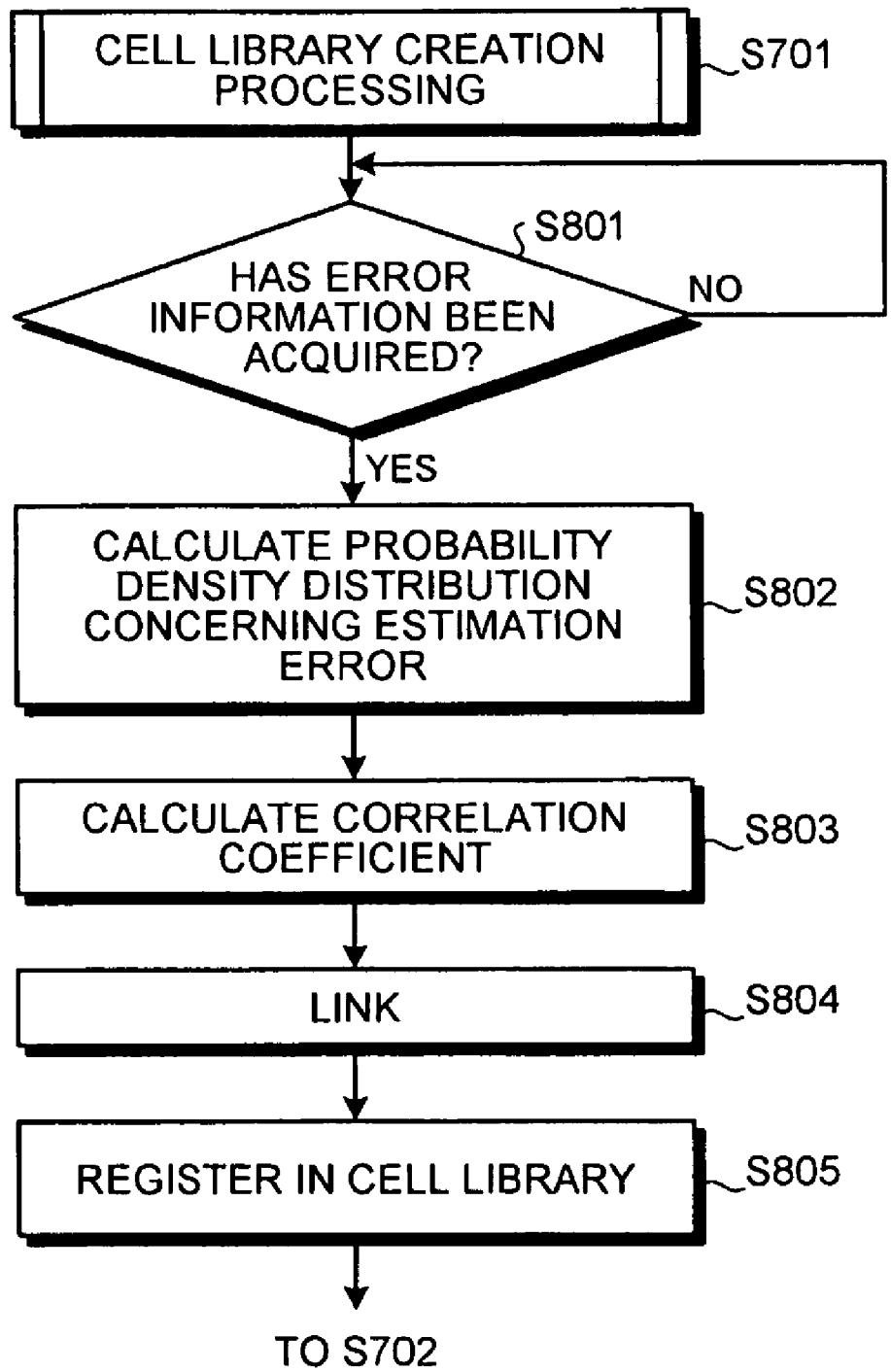
FIG. 8 is a flowchart of cell library creation processing (step S701)

FIG. 8 is a flowchart of cell library creation processing (step S701). As shown in the flowchart of FIG. 8, first, whether the acquiring unit 501 has acquired error information concerning a cell delay estimation error that is dependent on a characterizing tool that estimates delay in each cell is determined (step S801).

Here, the processing waits for acquisition of the error information (step S801: NO). When the error information is acquired (step S801: YES), the error calculator 502 calculates a probability density distribution concerning an estimation error in the delay of each cell based on the error information acquired by the acquiring unit 501 and a probability density distribution concerning delay in each cell obtained by the characterizing tool (step S802).

Then, the correlation calculator 504 calculates a correlation coefficient representing a mutual correlation between cells based on performance characteristics of each cell (step S803). The probability density distribution concerning delay in each cell obtained by the characterizing tool is stored in the cell library 200 in advance.

Then, the linking unit 503 links the probability density distribution concerning the estimation error calculated at the step S802 and the correlation coefficient representing the mutual correlation between the cells calculated at the step S803 with the cell library 200 (step S804) and registers the probability density distribution group concerning the estimation errors and the correlation coefficient group in the cell library 200, and the processing advances to step S702 depicted in FIG. 7.

The execution order of the processing at steps S802 and S803 may be inverted, or these steps may be simultaneously executed in parallel.

Figure 9:
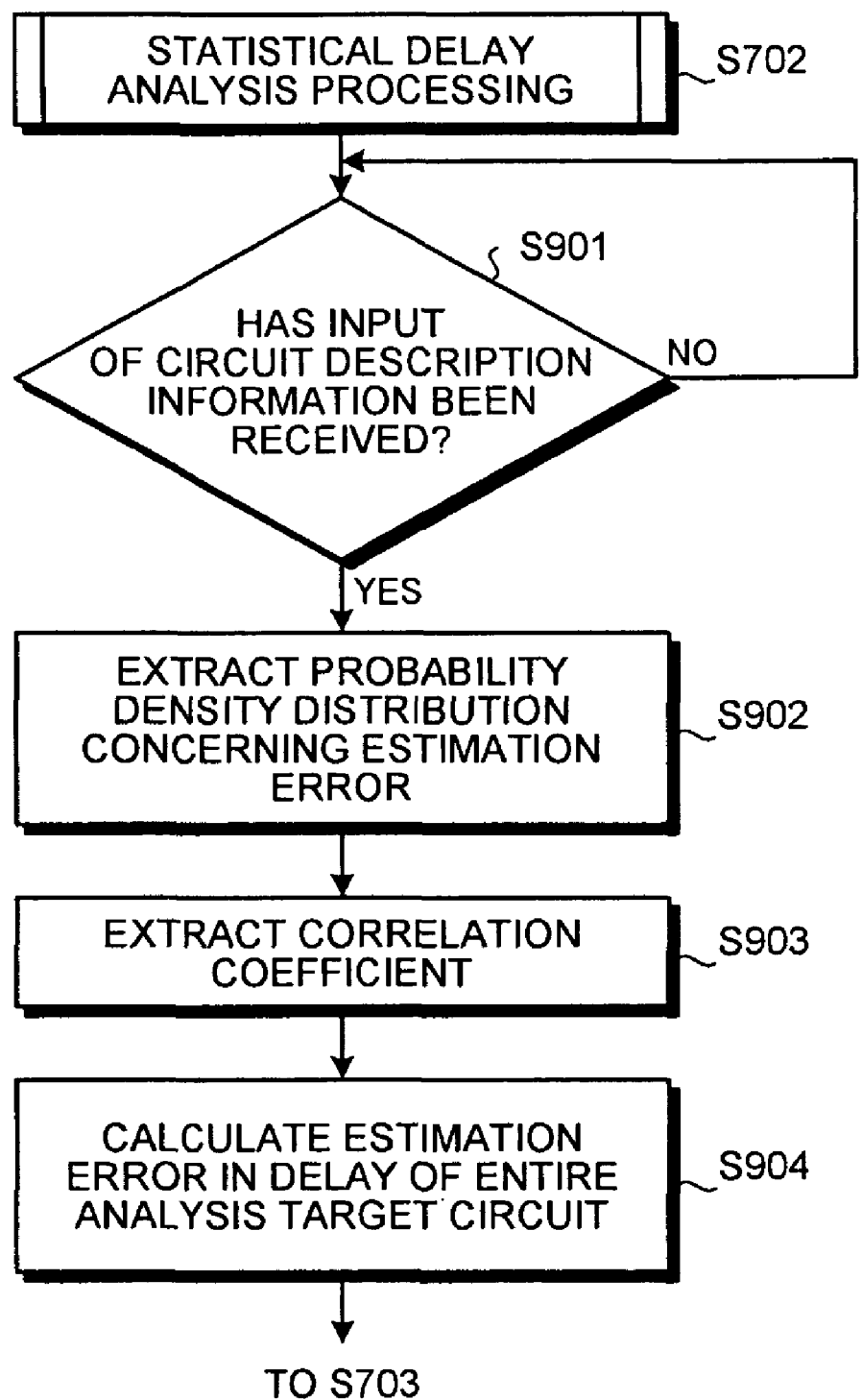
FIG. 9 is a flowchart of statistical delay analysis processing (step S702)

FIG. 9 is a flowchart of statistical delay analysis processing (step S702). As shown in the flowchart of FIG. 9, whether the input unit 505 has received input of circuit description information concerning the analysis target circuit is first determined (step S901).

Here, the processing waits for input of the circuit description information (step S901: NO). When input is received (step S901: YES), the extracting unit 506 extracts, based on the circuit description information input through the input unit 505, the probability density distribution concerning the estimation error in the delay of each cell from the cell library 200 after the cell library creation processing depicted in FIG. 8 (step S902).

Then, the extracting unit 506 extracts the correlation coefficient representing the mutual correlation between cells in the analysis target circuit from the cell library 200 after the cell library creation processing depicted in FIG. 8 (step S903).

Subsequently, the cumulative error calculator 507 calculates an estimation error in the delay of the entire analysis target circuit based on the probability density distribution concerning the estimation error extracted at step S902 and the correlation coefficient representing the mutual correlation between cells extracted at step S903 (step S904), and the processing advances to step S703 depicted in FIG. 7.

The execution order of the processing at steps S902 and S903 may be inverted, or these steps may be simultaneously executed in parallel.

The cell library creation processing depicted in FIG. 8 and the statistical delay analysis processing depicted in FIG. 9 may be individually executed. For example, the cell library creation processing may be executed in advance, the cell library 200 having the probability density distribution concerning an estimation error in the delay of each cell and the correlation coefficient representing a mutual correlation between cells registered therein may be created, and then the created cell library 200 and the contents stored therein may be used when executing the statistical delay analysis processing.

According to the embodiment of the present invention, the probability density distribution representing variation in a cell delay estimation error that is dependent on a characterizing tool that estimates the delay of each cell can be added to the contents stored in the cell library 200. The correlation coefficient representing a mutual correlation between cells can be added to the contents stored in the cell library 200.

An estimation error in the delay of the entire analysis target circuit, the delay that occurs due to an estimation error that is dependent on the characterizing tool, can be calculated based on the contents stored in the cell library 200. As a result, the estimation error in the delay of the entire analysis target circuit can be more accurately calculated with consideration of the mutual correlation between cells in the analysis target circuit.

An error rate in the delay of the entire analysis target circuit, the delay that occurs due to an estimation error in the delay of each cell with respect to a delay analysis result based on SSTA, can be presented as an output result. Therefore, a user can instinctively determine how much the error in the circuit delay that occurs due to the estimation error in the delay of each cell affects SSTA of the analysis target circuit.

Executing statistical delay analysis with consideration of the error in the delay of the entire analysis target circuit occurring due to the estimation error in the delay of each cell enables accurate understanding of a statistical variation of the analysis target circuit, thereby reducing an unnecessary delay margin.

As explained above, according to the delay analysis support apparatus, the delay analysis support method, and computer product, efficiently and accurately performing delay analysis of the analysis target circuit enables reducing a burden on a designer and shortening a design period.

The delay analysis support method explained in the present embodiment can be implemented by a computer such as a personal computer and a workstation executing a program that is prepared in advance. The program is recorded on a computer-readable recording medium such as a hard disk, a flexible disk, a CD-ROM, an MO, and a DVD, and is executed by being read out from the recording medium by a computer. The program can be a transmission medium that can be distributed through a network such as the Internet.

The delay analysis support apparatus 100 can be realized by an application specific integrated circuit (ASIC) such as a standard cell, a structured ASIC, or a programmable logic device (PLD) such as FPGA. Specifically, for example, the functional units 501 to 508 in the delay analysis support apparatus 100 are defined by using hardware description language (HDL) descriptions and the HDL descriptions are logically synthesized and supplied to the ASIC or the PLD, thereby manufacturing the delay analysis support apparatus 100.

As explained above, a ratio of an error in the delay of an entire analysis target circuit that occurs due to an estimation error in the delay of each cell with respect to a delay analysis result obtained by SSTA can be presented as an output result.

According to the embodiment described above, improved delay analysis accuracy can be realized, thereby reducing the design period.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A computer-readable, non-transitory medium storing therein a delay analysis support computer program that supports analysis of delay in a target circuit that includes a plurality of cells and causes a computer to execute:
   acquiring error information concerning a cell-delay estimation error that is dependent on a characterizing tool that estimates cell delay;
   calculating, based on the error information and a first probability density distribution that concerns the cell delay of each cell and is obtained from the cell delay estimated by the characterizing tool, a second probability density distribution that concerns the cell-delay estimation error of each cell; and
   linking the second probability density distribution and a cell library storing therein the first probability density distribution.

2. The computer-readable, non-transitory medium according to claim 1, wherein the computer program further causes the computer to execute calculating a correlation coefficient representing a mutual correlation between the cells based on performance characteristics of each cell, and
   the linking includes linking the correlation coefficient and the cell library.

3. The computer-readable, non-transitory medium according to claim 2, wherein the computer program further causes the computer to execute:
   receiving input of circuit description information concerning the target circuit;
   extracting, based on the circuit description information, the second probability density distribution from a probability density distribution group linked at the linking;
   calculating, based on the second probability density distribution extracted at the extracting, a circuit-delay estimation error of the target circuit by cumulating the cell-delay estimation error of each cell in the target circuit; and
   outputting a calculation result of the calculating the circuit-delay estimation error of the target circuit.

4. The computer-readable, non-transitory medium according to claim 3, wherein
   the extracting includes extracting the correlation coefficient representing the mutual correlation between the cells in the target circuit from a correlation coefficient group linked at the linking, and
   the calculating the circuit-delay estimation error of the target circuit includes calculating the circuit-delay estimation error of the target circuit based on the correlation coefficient extracted at the extracting the correlation coefficient.

5. The computer-readable, non-transitory medium according to claim 3, wherein the outputting includes outputting a delay analysis result of the target circuit based on the first probability density distribution concerning the cell-delay of each cell in the target circuit.

6. A delay analysis support apparatus that supports analysis of delay in a target circuit that includes a plurality of cells, the delay analysis support apparatus comprising:
   an acquiring unit that acquires error information concerning a cell-delay estimation error that is dependent on a characterizing tool that estimates cell delay;
   an error calculating unit that calculates, based on the error information and a first probability density distribution that concerns the cell delay of each cell and is obtained from the cell delay estimated by the characterizing tool, a second probability density distribution that concerns the cell-delay estimation error of each cell; and
   a linking unit that links the second probability density distribution and a cell library storing therein the first probability density distribution.

7. The delay analysis support apparatus according to claim 6, further comprising a correlation calculating unit that calculates a correlation coefficient representing a mutual correlation between the cells based on performance characteristics of each cell,
   wherein the linking unit links the correlation coefficient and the cell library.

8. The delay analysis support apparatus according to claim 7, further comprising:
   an input unit that receives input of circuit description information concerning the target circuit;
   an extracting unit that extracts, based on the circuit description information, the second probability density distribution from a probability density distribution group linked by the linking unit;
   a cumulative error calculating unit that calculates, based on the second probability density distribution extracted by the extracting unit, a circuit-delay estimation error of the target circuit by cumulating the cell-delay estimation error of each cell in the target circuit; and
   an output unit that outputs a calculation result of the cumulative error calculating unit.

9. The delay analysis support apparatus according to claim 8, wherein the extracting unit extracts the correlation coefficient representing the mutual correlation between the cells in the target circuit from a correlation coefficient group linked by the linking unit, and the cumulative error calculating unit calculates the circuit-delay estimation error of the target circuit based on the correlation coefficient extracted by the extracting unit.

10. The delay analysis support apparatus according to claim 8, wherein the output unit further outputs a delay analysis result of the target circuit based on the first probability density distribution concerning the cell-delay of each cell in the target circuit.

11. A delay analysis support method that supports analysis of delay in a target circuit that includes a plurality of cells, the delay analysis support method comprising:

acquiring, by a computer, error information concerning a cell-delay estimation error that is dependent on a characterizing tool that estimates cell delay;

calculating, by the computer, based on the error information and a first probability density distribution that concerns the cell delay of each cell and is obtained from the cell delay estimated by the characterizing tool, a second probability density distribution that concerns the cell-delay estimation error of each cell; and linking, by the computer, the second probability density distribution and a cell library storing therein the first probability density distribution.

12. The delay analysis support method according to claim 11, further comprising calculating a correlation coefficient representing a mutual correlation between the cells based on performance characteristics of each cell, wherein the linking includes linking the correlation coefficient and the cell library.

13. The delay analysis support method according to claim 12, further comprising:

receiving input of circuit description information concerning the target circuit;

extracting, based on the circuit description information, the second probability density distribution from a probability density distribution group linked at the linking;

calculating, based on the second probability density distribution extracted at the extracting, a circuit-delay estimation error of the target circuit by cumulating the cell-delay estimation error of each cell in the target circuit; and outputting a calculation result of the calculating the circuit-delay estimation error of the target circuit.

14. The delay analysis support method according to claim 13, wherein the extracting includes extracting the correlation coefficient representing the mutual correlation between the cells in the target circuit from a correlation coefficient group linked at the linking, and the calculating the circuit-delay estimation error of the target circuit includes calculating the circuit-delay estimation error of the target circuit based on the correlation coefficient extracted at the extracting the correlation coefficient.

15. The delay analysis support method according to claim 13, wherein the outputting includes outputting a delay analysis result of the target circuit based on the first probability density distribution concerning the cell-delay of each cell in the target circuit.

* * * * *